(12) United States Patent
Tashiro

(10) Patent No.: US 9,561,586 B2
(45) Date of Patent: Feb. 7, 2017

(54) ARTICULATED ROBOT, AND CONVEYING DEVICE

(71) Applicant: ULVAC, Inc., Kanagawa (JP)

(72) Inventor: Yukihito Tashiro, Tokyo (JP)

(73) Assignee: Ulvac, Inc., Chigasaki-Shi (JP)

( * ) Notice: Subject to any disclaimer, the term of this patent is extended or adjusted under 35 U.S.C. 154(b) by 40 days.

(21) Appl. No.: 14/388,618

(22) PCT Filed: Mar. 26, 2013

(86) PCT No.: PCT/JP2013/058742
§ 371 (c)(1),
(2) Date: Jan. 21, 2015

(87) PCT Pub. No.: WO2013/146763
PCT Pub. Date: Oct. 3, 2013

(65) Prior Publication Data
US 2015/0343630 A1 Dec. 3, 2015

(30) Foreign Application Priority Data

Mar. 29, 2012 (JP) .................. 2012-077328

(51) Int. Cl.
*B65H 1/00* (2006.01)
*B25J 9/04* (2006.01)
*B25J 18/00* (2006.01)
*B25J 15/00* (2006.01)
*H01L 21/687* (2006.01)
*H01L 21/67* (2006.01)
*H01L 21/677* (2006.01)
(Continued)

(52) U.S. Cl.
CPC ............. *B25J 9/042* (2013.01); *B25J 15/0014* (2013.01); *B25J 18/00* (2013.01);
(Continued)

(58) Field of Classification Search
CPC ......... B25J 9/042; B25J 18/00; B25J 15/0014; H01L 21/68707; H01L 21/67742; H01L 21/67161; Y10S 901/30; Y10S 901/27; Y10S 901/21
(Continued)

(56) References Cited

U.S. PATENT DOCUMENTS 5,083,896 A * 1/1992 Uehara ................... B25J 9/042
414/744.5
5,908,281 A * 6/1999 Kiley ...................... B25J 9/106
414/744.5
(Continued)

FOREIGN PATENT DOCUMENTS

JP   H08327959 A   12/1996
JP   2001310287 A  11/2001
(Continued)

OTHER PUBLICATIONS

International Search Report issued in PCT/JP2013/058742, dated Jul. 2, 2013.

*Primary Examiner* — Basil Katcheves
(74) *Attorney, Agent, or Firm* — Locke Lord LLP; Howard M. Gitten

(57) ABSTRACT

An articulated robot and a conveying device capable of increasing conveying speed are provided. An articulated robot conveys a workpiece from a first processing part to a second processing part linearly disposed with respect to the first processing part. The articulated robot includes: an extensible arm; and a grip part (3) provided on a lower side of a distal end of the arm and for gripping the workpiece, in which the grip part is advanced from its one end into the first processing part, and also the grip part is advanced from its another end opposite to the one end into the second processing part.

9 Claims, 18 Drawing Sheets

(52) U.S. Cl.
CPC .. *H01L 21/67161* (2013.01); *H01L 21/67742* (2013.01); *H01L 21/68707* (2013.01); *Y10S 901/21* (2013.01); *Y10S 901/27* (2013.01); *Y10S 901/30* (2013.01)

(58) Field of Classification Search
USPC ................................. 414/222.08, 744.5, 806
See application file for complete search history.

(56) References Cited

U.S. PATENT DOCUMENTS

| | | | |
|---|---|---|---|
| 2004/0223132 A1 | 11/2004 | Nishi et al. | |
| 2007/0110554 A1* | 5/2007 | Ono | B25J 9/042 414/744.5 |
| 2013/0149076 A1* | 6/2013 | Cox | B65G 49/00 414/217 |
| 2015/0190933 A1* | 7/2015 | Kremerman | B25J 17/02 414/806 |
| 2016/0079100 A1* | 3/2016 | Gould | H01L 21/67196 438/689 |

FOREIGN PATENT DOCUMENTS

| | | | |
|---|---|---|---|
| JP | 2006346699 A | * | 12/2006 |
| JP | 2008114995 A | * | 5/2008 |
| JP | 2009095940 A | * | 5/2009 |
| JP | 2009095940 A | | 5/2009 |
| JP | 2010253569 A | | 11/2010 |
| WO | WO-03017344 A1 | | 2/2003 |
| WO | WO-2008117350 A1 | | 10/2008 |

* cited by examiner

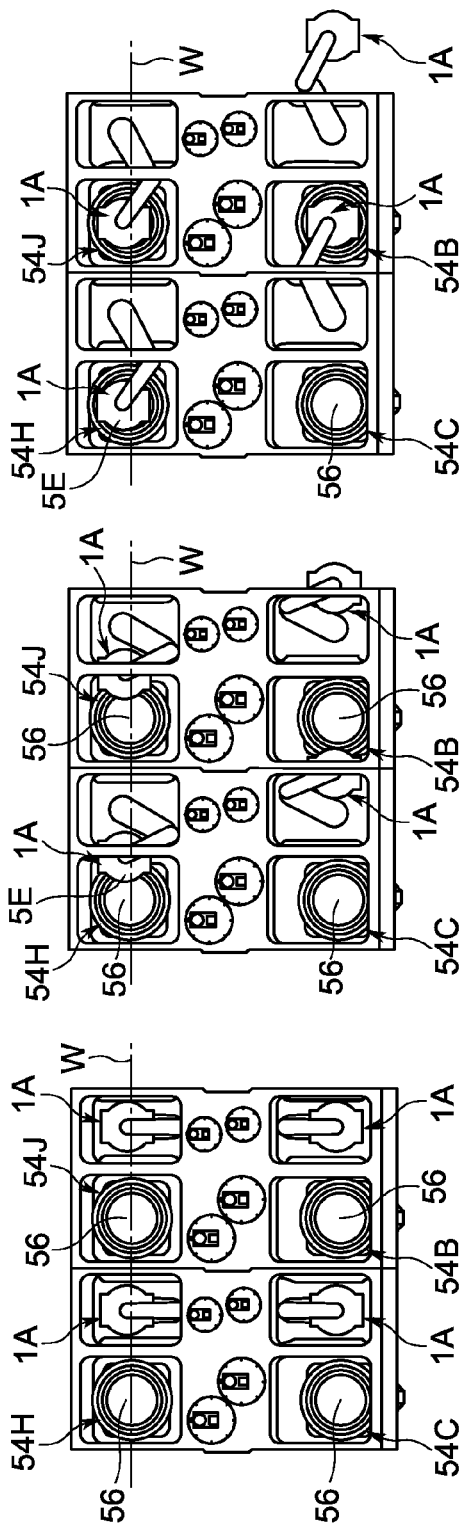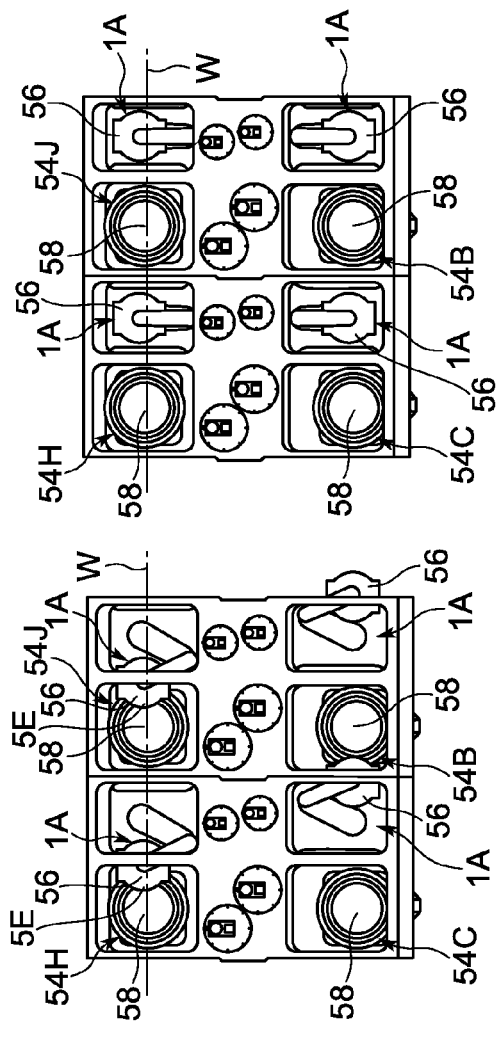

ARTICULATED ROBOT, AND CONVEYING DEVICE

TECHNICAL FIELD

The present invention relates to an articulated robot and a conveying device.

BACKGROUND ART

An articulated robot is provided in a conveying part that performs loading/unloading of a workpiece to/from a processing part in a processing apparatus for continuously processing workpieces in a plurality of processing parts which are successively installed. In a semiconductor processing apparatus which is typical for such a processing apparatus, a cluster type processing apparatus in which processing parts as a working part are radially disposed around a conveying part, and an in-line type processing apparatus in which processing parts are linearly disposed are used. A cluster type processing apparatus has a problem in that the number of the processing parts are limited to 5 or 6 at maximum. In contrast to this, an in-line type processing apparatus has an advantage that the number of the processing parts can be increased as needed.

As a conventional articulated robot, there is disclosed a robot arm apparatus including: a first arm which is rotatably mounted to a base via a first transmission mechanism; a second arm which is rotatably mounted to a distal end part of the first arm via a second transmission mechanism; and a fork member which is rotatably linked to a distal end part of the second arm via a third transmission mechanism and for mounting an object to be transferred (for example, Patent Literature 1). The fork member has a distal end part which is bifurcated, and a base end part which is supported by the second arm. In the above described Patent Literature 1, the robot arm apparatus is configured such that the fork member always advances from its distal end part into a processing part.

CITATION LIST

Patent Literature

Patent Literature 1: Japanese Patent Laid-Open No. 2001-310287

SUMMARY OF INVENTION

Technical Problem

In the case of the above described Patent Literature 1, since each processing part has an entrance in a different direction in a processing apparatus including a plurality of processing parts, it is not possible to make the fork member advance into each processing part from its distal end part of the fork member only through extension/contraction motion of the first and second arms. For this reason, when conveying a workpiece from one processing part to another processing part, it is necessary that the first and second arms are rotated to align the direction of the distal end part of the fork member with the entrance of each processing part. As a result, in the above described Patent Literature 1, in addition to the motion of extending/contracting the first and second arms to make the fork member advance/retreat into/from the processing part, the motion of rotating the first and second arms to align the direction of the distal end part of the fork member with the entrance of the processing part becomes necessary, thereby leading to a problem that the conveying speed is decreased. Particularly, in the case of an in-line type processing apparatus, since entrances of the processing parts which are linearly disposed are opposed to each other, the first arm needs to be rotated by 180° to align the direction of the distal end of the fork member with the entrance of each processing part. Therefore, in the case of an in-line type processing apparatus, the rotational motion of the first arm significantly affects the conveying speed.

Further, in conventional arts, there is a disadvantage, in addition to a lowered conveying speed, that since the first arm is rotated by 180° and thereby a substrate is conveyed to a processing chamber by being rotated by 180° each time it is conveyed, resulting in that the placement direction of the substrate is changed from one processing chamber to another.

Accordingly, it is an object of the present invention to provide an articulated robot and a conveying device which can increase conveying speed.

Solution to Problem

An articulated robot according to claim 1 of the present invention is an articulated robot for conveying a workpiece from a first processing part to a second processing part which is linearly disposed with respect to the first processing part, the articulated robot including: an extensible arm; and a grip part provided on a lower side of a distal end of the arm and for gripping the workpiece, wherein the grip part is advanced from one end of the grip part into the first processing part, and also the grip part is advanced from another end opposite to the one end of the grip part into the second processing part.

A conveying device according to claim 6 of the present invention includes: a first processing part; and a conveying part interconnected with the first processing part, wherein the conveying part is provided with an articulated robot, the articulated robot including: an extensible arm; and a grip part provided on a lower side of a distal end of the arm and for gripping a workpiece, wherein the articulated robot causes the grip part to advance from one end of the grip part into the first processing part, and causes the grip part to advance from another end opposite to the one end of the grip part into a second processing part, the second processing part being linearly disposed with respect to the first processing part with the conveying part being interposed therebetween.

Advantageous Effects of Invention

According to the present invention, since the motion to change the direction of the grip part when moving the grip part from the first processing part to the second processing part can be omitted, it is possible to increase the conveying speed. Further, even when conveyance is performed repeatedly, it is possible to convey a substrate while always keeping it in the same direction.

BRIEF DESCRIPTION OF DRAWINGS

FIG. 7 is a partial plan view stepwisely showing use states of the in-line type processing apparatus to which the articulated robot according to the first embodiment is applied; in which FIG. 7A shows a state in which the arm is at a point of origin, FIG. 7B shows a state in which the grip part has advanced into a processing part of upstream side, FIG. 7C shows a state in which the grip part has received a substrate in a processing part of upstream side, FIG. 7D shows a state in which the grip part has started retreating from a processing part of upstream side, and FIG. 7E shows a state in which the grip part is passing through the point of origin;

FIG. 8 is a diagram stepwisely showing use states of a placing table of the processing part in the in-line processing apparatus to which the articulated robot according to the first embodiment is applied, in which

FIG. 9 is a partial plan view stepwisely showing use states of the in-line type processing apparatus to which the articulated robot according to the first embodiment is applied, in which

REFERENCE SIGNS LIST

Figure 1:
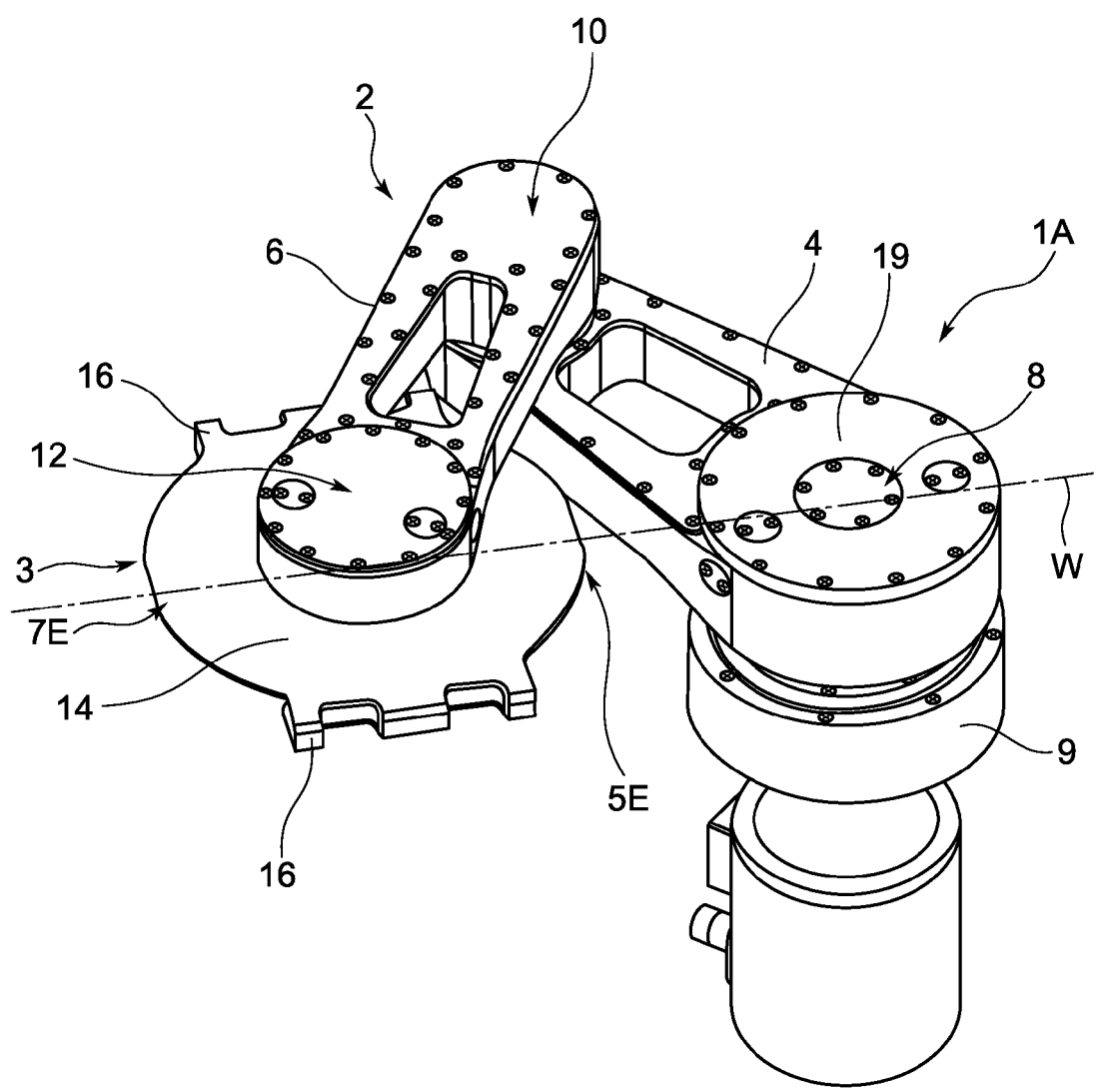
FIG. 1 is a perspective view showing a general configuration of an articulated robot according to a first embodiment.

1A: Articulated robot
2: Arm
3: Grip part
4: First arm
5E: One end
6: Second arm
7E: Other end
8: First joint part
10: Second joint part
12: Third joint part
16: Folded part
17: Base table
50: In-line type processing apparatus
54: Processing part
55: Conveying part
56: Substrate (Workpiece)
60: Angle adjustment part
94: Conveying module

DESCRIPTION OF EMBODIMENTS

Hereafter, embodiments of the present invention will be described in detail with reference to the drawings.

1. First Embodiment (Configuration of Articulated Robot)

An articulated robot according to a first embodiment will be described. An articulated robot 1A shown in FIG. 1 includes: an extensible arm 2; a grip part 3 provided at a distal end of the arm 2 and for holding a substrate; and a base part 9 for rotatably pivoting a base end of the arm 2. The arm 2 has a first arm 4, and a second arm 6 provided so as to overlap on the first arm 4.

The first arm 4 is rotatably linked at its base end to the base part 9 by a first joint part 8. The second arm 6 is rotatably linked at its base end to the distal end of the first arm 4 by a second joint part 10. In the case of the present embodiment, the first arm 4 and the second arm 6 are formed so as to have a substantially equal length L.

The grip part 3 is rotatably linked to the distal end of the second arm 6 by a third joint part 12. The grip part 3, which is provided substantially horizontally, includes: a top plate part 14 having a disc shape; and a plurality of (two in the present figure) folded parts 16 which are formed to be bent into a U shape from both side parts of the top plate part 14 toward a moving axis W in the figure and further to be substantially parallel with the moving axis W. The moving axis W refers to an axis linking a first processing part to be described later with a second processing part which is linearly disposed with respect to the first processing part.

In the present embodiment, the grip part 3 is disposed in a space in the vertical direction between the second arm 6 and the first arm 4, and is rotatably pivoted to the distal end of the second arm 6 at a substantially center of an upper surface of the top plate part 14 by the third joint part 12. Note that the shape of the member of the top plate part 14 will not be limited to a disc shape and may be a rectangular shape.

The articulated robot 1A moves the grip part 3 along the moving axis W with the folded part 16 being kept parallel with the moving axis W by extending and contracting the arm 2 made up of the first arm 4 and the second arm 6.

Figure 2:
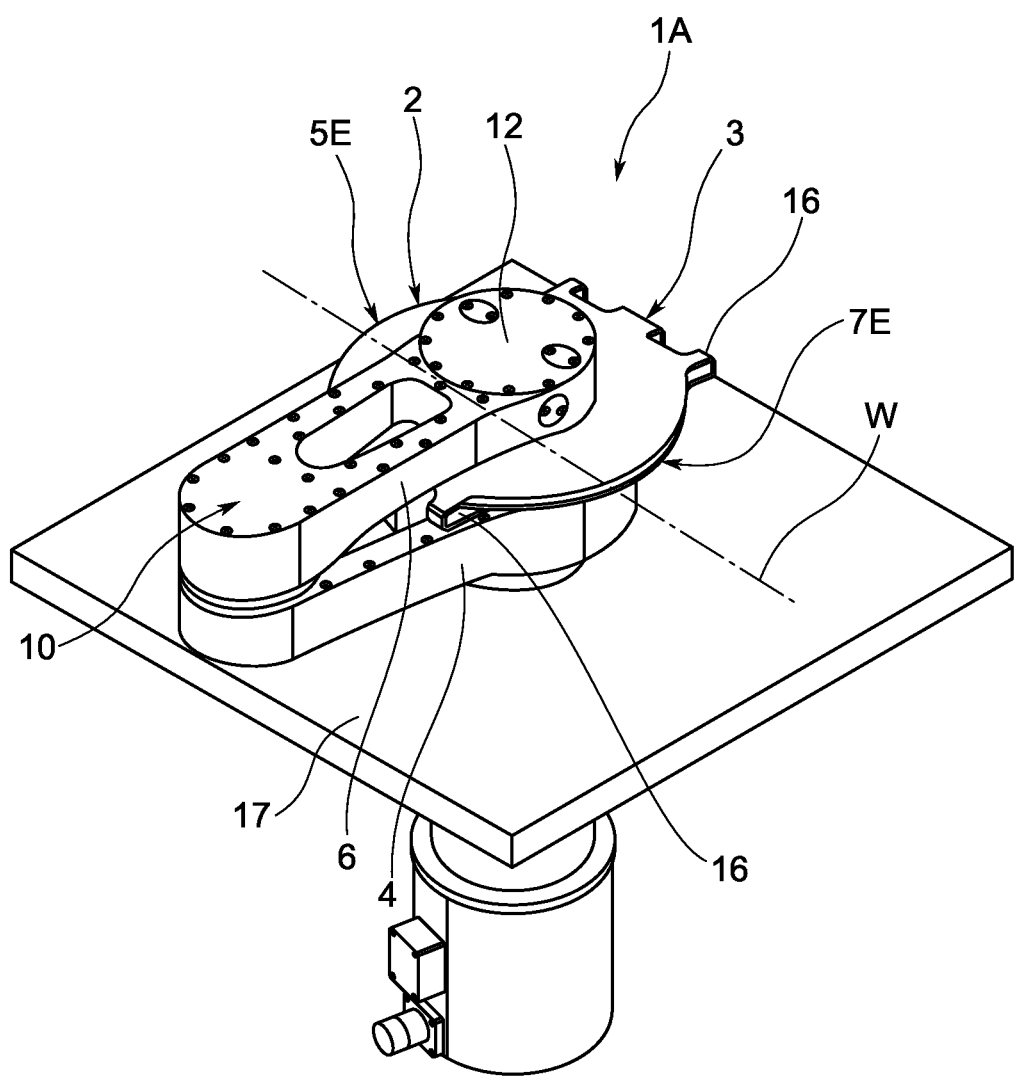
FIG. 2 is a perspective view showing a use state of the articulated robot according to the first embodiment, in which an arm is contracted.

As shown in FIG. 2, the articulated robot 1A is fixed to a base table 17 at the base part 9 (FIG. 1). Note that examples of the base table 17 include an inner wall of the first processing part (a vacuum chamber). In the present figure, the arm 2 is in a contracted state, that is, a state in which the first arm 4 and the second arm 6 are overlapped in the vertical direction. In the case of the present embodiment, the first joint part 8 and the third joint part 12 overlap coaxially resulting from that the first arm 4 and the second arm 6 are formed to have a substantially equal length.

Figure 3:
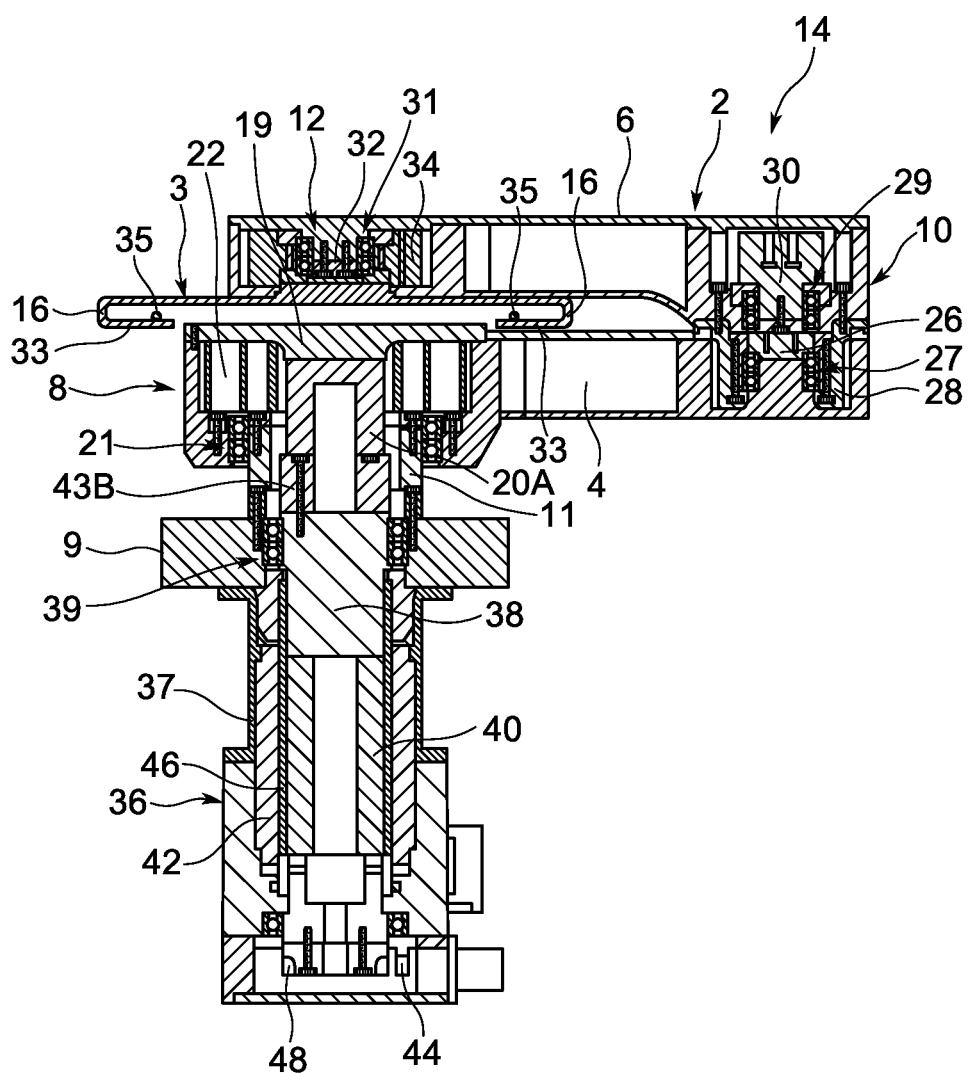
FIG. 3 is a longitudinal sectional view of the articulated robot according to the first embodiment.

While FIG. 3 is a longitudinal sectional view of the articulated robot shown in FIG. 2, illustration of the base table 17 which is fixed to the upper surface of the base part 9 is omitted for convenience. As shown in FIG. 3, the first joint part 8 includes a first support shaft 20A fixed to the base end of the first arm 4, and a first pulley 22 provided concentrically on the outside of the first support shaft 20A. The first pulley 22 is fixed to the base part 9 via a fixing shaft 11. The first support shaft 20A is connected to a first transfer shaft 43A which is coaxially provided. The first arm 4 is connected, at a top part 19 provided at its base end, to the first support shaft 20A and is rotatably pivoted to the fixing shaft 11 via a first bearing 21.

As shown in FIG. 3, the second joint part 10 includes: a second support shaft 26 fixed to a distal end of the first arm 4; a second pulley 28 rotatably pivoted to the second support shaft 26 via a second bearing 27; and a third pulley 30 fixed to a distal end of the second support shaft 26. The second arm 6 is fixed to the second pulley 28 at its base end. The third pulley 30 is rotatably pivoted to the base end of the second arm 6 via the third bearing 29.

As shown in FIG. 3, the third joint part 12 has a third support shaft 32 fixed to the distal end of the second arm 6, and a fourth pulley 34 which is rotatably pivoted to the third support shaft 32 via a fourth bearing 31. The grip part 3 is fixed to the distal end of the fourth pulley 34. A plurality of pins 35 for placing a substrate thereon are provided on a folded surface 33 of the folded part 16, and in the present embodiment, a total of four of them in the grip part 3.

A belt (not shown) is mounted over and between the first pulley 22 and the second pulley 28. The rotational ratio between the first pulley 22 and the second pulley 28 is set to 1:2. The second pulley 28 and the third pulley 30 are directly linked to each other, and the rotational ratio therebetween is set to 2:2. A belt (not shown) is mounted over and between the third pulley 30 and the fourth pulley 34. The rotational ratio between the third pulley 30 and the fourth pulley 34 is set to 2:1.

The articulated robot 1A is linked to a first drive part 36 at the base end of the first arm 4. The first drive part 36 has a main body 37 fixed to the base part 9, and a main shaft 38, a rotor 40, a stator 42 made up of an electric magnet, and an encoder 44 for detecting the position of an encoder ring 48, which are provided in the main body 37.

The main shaft 38 is linked at its distal end to the first support shaft 20A via a first transfer shaft 43A which is coaxially provided. Moreover, the main shaft 38 is rotatably pivoted to the base part 9 via a fifth bearing 39. According to this configuration, the first arm 4 is linked at the top part 19 to the main shaft 38 via the first support shaft 20A and the first transfer shaft 43A, and is rotatably pivoted to the base table 17 via the fifth bearing 39.

The rotor 40 is linked to the main shaft 38. The stator 42 is provided concentrically with the rotor 40 via an isolation wall 46. Note that this isolation wall 46 may be an apparatus which is not used in the atmosphere. The encoder 44 is installed at a position where detection of the encoder ring 48 provided at the base end of the rotor 40 is possible.

The rotor 40 is rotated by rotational force imparted by magnetic force from the stator 42. The said rotational force is transferred to the first support shaft 20A via the main shaft 38. The encoder 44 detects a rotational angle of the rotor 40 and outputs it to a control computer not shown. The control computer controls the rotational angle of the first support shaft 20A to be a predetermined rotational angle according to the rotational angle of the rotor 40 through feedback control.

Figure 4:
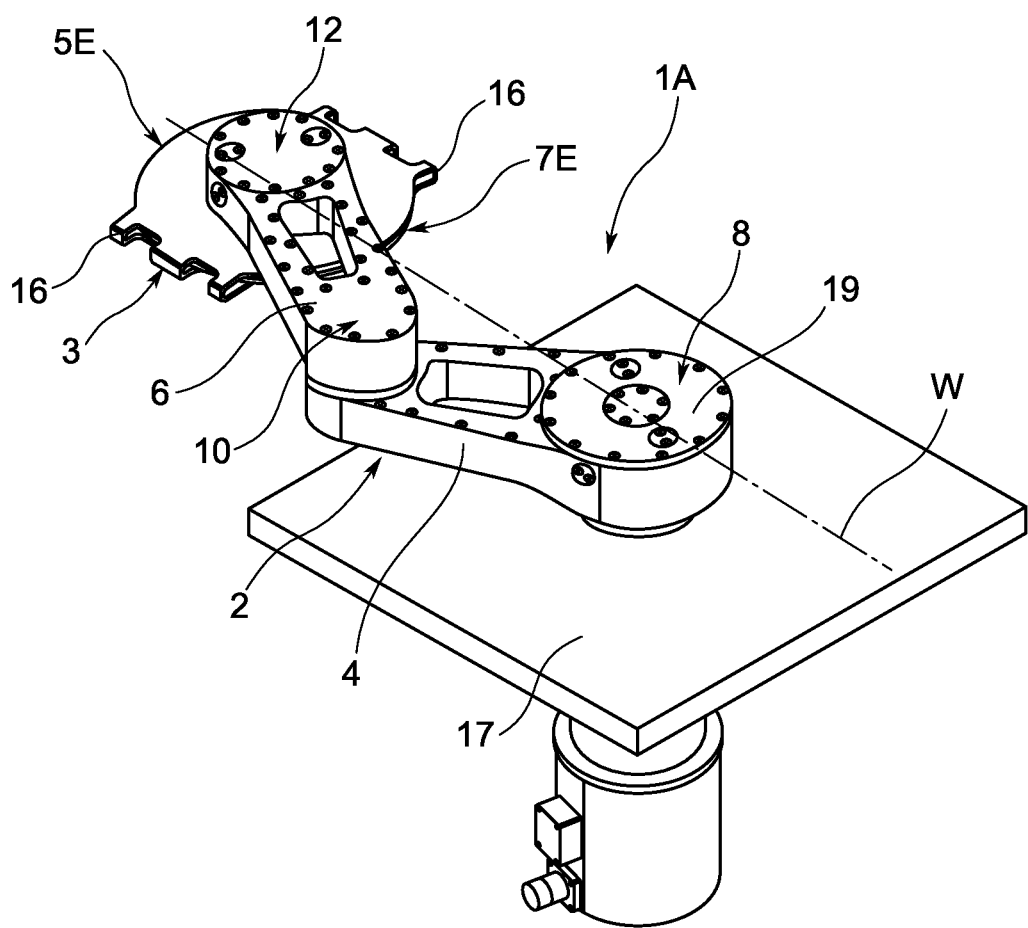
FIG. 4 is a perspective view showing a use state of the articulated robot according to the first embodiment, in which the arm is extended in one direction.
Figure 5:
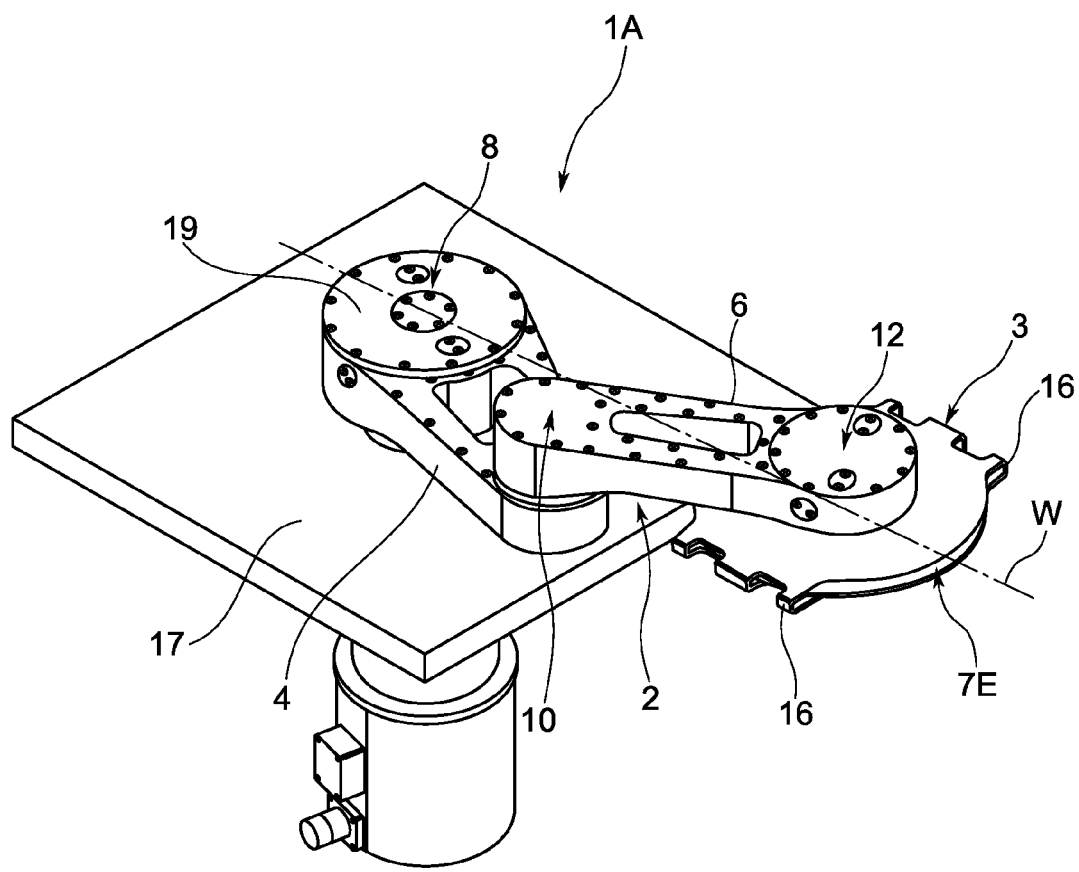
FIG. 5 is a perspective view showing a use state of the articulated robot according to the first embodiment, in which the arm is extended in another direction.

Controlling the rotational angle of the first support shaft 20A to a predetermined rotational angle, the articulated robot 1A can extend the arm 2 as shown in FIG. 4, thereby moving the grip part 3 in one direction along the moving axis W. Also, by controlling the rotational angle of the first support shaft 20A to a predetermined rotational angle to temporarily contract the arm 2 (FIG. 2) and to successively extend the arm 2, the articulated robot 1A can move the grip part 3 in another direction opposite to the one direction along the moving axis W (FIG. 5). In the case of the present embodiment, when the arm 2 is successively shifted into a state of being extended in one direction (FIG. 4), a state of being contracted (FIG. 2), and a state of being extended in another direction (FIG. 5), the grip part 3 moves while the folded part 16 is kept in parallel with the moving axis W. Further, when the arm 2 is successively shifted into a state of being extended in one direction (FIG. 4), a state of being contracted (FIG. 2), and a state of being extended in the other direction (FIG. 5), the grip part 3 moves on the moving axis W while one end 5E facing one direction and the other end 7E facing the other direction.

(Operation of Articulated Robot)

Operation of the articulated robot 1A according to the present embodiment will be described with reference to FIGS. 1, 2, 4 and 5. The state in which the arm 2 is contracted, that is, the state in which the first arm 4 and the second arm 6 are overlapped in the vertical direction (FIG. 2) is defined as a point of origin. At the point of origin, the first joint part 8 (FIG. 1) and the third joint part 12 are in a state of being coaxially overlapped. Moreover, the grip part 3 is in a state in which the folded part 16 is in parallel with the moving axis W.

Description will be made on a case in which the first drive part 36 rotates the first support shaft 20A by a predetermined angle, for example, an angle of $\alpha$ in the clockwise direction with respect to the arm 2 located at the point of origin as shown in FIG. 2. As the first support shaft 20A rotates, the first arm 4 which is fixed to the first support shaft 20A at the top part 19 rotates centering on the first joint part 8 by an angle of $\alpha$ in the clockwise direction.

Rotation of the first arm 4 causes a belt to relatively travel between the first pulley 22 and the second pulley 28, and thus the second pulley 28, which is linked to the first pulley 22 with the belt, is reversely rotated with respect to the first arm 4, that is, rotated in the counterclockwise direction. When the second pulley 28 rotates in the counterclockwise direction, the second arm 6, which is fixed to the second pulley 28, rotates along with the second pulley 28 in the counterclockwise direction centering on the second joint part 10. Since the rotational ratio between the first pulley 22 and the second pulley 28 is set to 1:2, when the first arm 4 rotates by $\alpha$, the rotational angle of the second arm 6 with respect to the first arm 4 will be $2\alpha$ in the counterclockwise direction. Rotation of the second arm 6 causes the fourth joint part, which is at the distal end of the second arm 6, to move from the point of origin in one direction to a position which is apart therefrom by 2L sin α on the moving axis W.

Rotation of the second arm 6 causes a belt to relatively travel between the third pulley 30 and the fourth pulley 34, and thus the fourth pulley 34, which is linked to the third pulley 30 with the belt, is reversely rotated with respect to the second arm 6, that is, rotated in the clockwise direction. When the third pulley 30 rotates in the clockwise direction, the grip part 3, which is fixed to the fourth pulley 34, rotates along with the fourth pulley 34 in the clockwise direction centering on the third joint part 12. Since the rotational ratio between the third pulley 30 and the fourth pulley 34 is set to 2:1, the rotational angle of the grip part 3 with respect to the second arm 6 will be α in the clockwise direction. Rotation of the grip part 3 causes the grip part 3 to retain a state in which the folded part 16 is in parallel with the moving axis W and one end 5E faces in one direction (FIG. 4).

In this way, the articulated robot 1A can make the arm 2 extend in one direction by rotating the first support shaft 20A by an angle of α in the clockwise direction with respect to the arm 2 located at the point of origin.

Next, a case in which the first drive part 36 rotates the first support shaft 20A by a predetermined angle, for example, an angle of 2α in the counterclockwise direction with respect to the arm 2 which is extended in one direction as shown in FIG. 4 will be described in a stepwise manner. First, a state in which the first support shaft 20A has been rotated by an angle of α in the counterclockwise direction will be described.

As the first support shaft 20A rotates, the first arm 4 rotates by an angle of α in the counterclockwise direction centering on the first joint part 8. The second arm 6 is caused to reversely rotate with respect to the first arm 4, that is, to rotate in the clockwise direction centering on the second joint part 10, by the rotation of the first arm 4. Since the rotational ratio between the first pulley 22 and the second pulley 28 is set to 1:2, the rotational angle of the second arm 6 with respect to the first arm 4 will be 2α in the clockwise direction. Rotation of the second arm 6 causes the third joint part 12, which is at the distal end of the second arm 6, to move from the point of origin in one direction to a position which is apart therefrom by 2L sin α on the moving axis W.

The grip part 3 rotates in the reverse direction with respect to the second arm 6, that is, in the counterclockwise direction centering on the third joint part 12 concurrently with the first arm 4 and the second arm 6. Since the rotational ratio between the third pulley 30 and the fourth pulley 34 is set to 2:1, the rotational angle of the grip part 3 with respect to the second arm 6 will be α in the counterclockwise direction. Rotation of the grip part 3 retains a state in which the folded part 16 is in parallel with the moving axis W (FIG. 2).

Thus, the articulated robot 1A returns to the point of origin by rotating the first support shaft 20A by an angle of α in the counterclockwise direction with respect to the arm 2 which is extended in one direction.

Further, a state in which the first support shaft 20A is rotated from the point of origin by an angle of α in the counterclockwise direction will be described. Rotation of the first support shaft 20A causes the first arm 4 to further rotate by an angle of α centering on the first joint part 8 in the counterclockwise direction. The second arm 6 is caused to rotate in the reverse direction with respect to the first arm 4, that is, in the clockwise direction centering on the second joint part 10 by the rotation of the first arm 4. Since the rotational ratio between the first pulley 22 and the second pulley 28 is set to 1:2, the rotational angle of the second arm 6 with respect to the first arm 4 will be 2α in the clockwise direction. Rotation of the second arm 6 causes the third joint part 12, which is at the distal end of the second arm 6, to move from the point of origin in another direction to a position which is apart therefrom by 2L sin α on the moving axis W.

The grip part 3 rotates in the reverse direction with respect to the second arm 6, that is, in the counterclockwise direction centering on the third joint part 12 concurrently with the first arm 4 and the second arm 6. Since the rotational ratio between the third pulley 30 and the fourth pulley 34 is set to 2:1, the rotational angle of the grip part 3 with respect to the second arm 6 will be α in the counterclockwise direction. Rotation of the grip part 3 causes the grip part 3 to retain a state in which the folded part 16 is in parallel with the moving axis W, and another end 7E faces in the other direction (FIG. 5).

In this way, the articulated robot 1A can make the arm 2 extend in the other direction by rotating the first support shaft 20A by an angle of α in the counterclockwise direction with respect to the arm 2 located at the point of origin.

Moreover, the articulated robot 1A returns to the point of origin by rotating the first support shaft 20A by an angle of α in the clockwise direction with respect to the arm 2 which is extended in the other direction.

Since the articulated robot 1A according to the present embodiment can omit the motion of switching the direction of the grip part 3 when moving the grip part 3 from one direction to another direction on the moving axis W, it is possible to increase the conveying speed.

(Configuration of In-Line Type Processing Apparatus)

An in-line type processing apparatus as a conveying device to which the articulated robot 1A according to the present embodiment is applied will be described with reference to FIG. 6.

Figure 6:
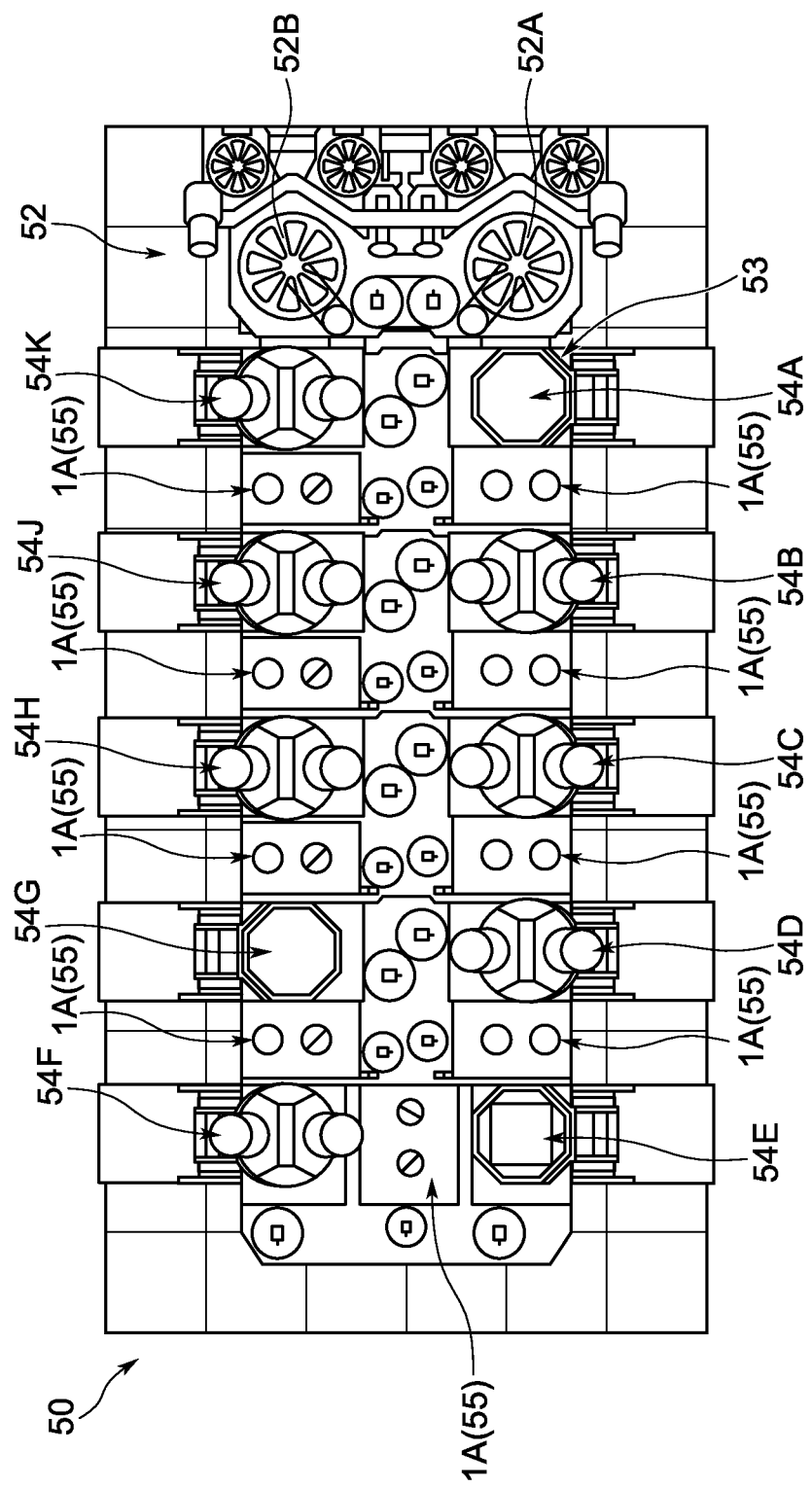
FIG. 6 is a plan view showing an example of an in-line type processing apparatus, to which the articulated robot according to the first embodiment is applied.

An in-line type processing apparatus 50 shown in FIG. 6 includes a load lock part 52 and a processing line 53. The processing line 53 has a plurality of processing parts (chambers) 54 (54A, 54B, 54C, 54D, 54E, 54F, 54G, 54H, 54J, 54K) which are disposed into an inverted U-shape, and a conveying part 55 disposed between each processing parts 54. The load-lock part 52 has a carry-in part 52A for carrying a workpiece into the processing line 53, and a carry-out part 52B for carrying out a workpiece from the processing line 53. The processing part 54 is not particularly limited, and for example a vacuum apparatus such as a sputtering apparatus and a CVD (Chemical vapor deposition) apparatus, an annealing apparatus, a cooling apparatus, a cleaning apparatus, a coating apparatus, and an etching apparatus can be applied.

In the present embodiment, the in-line type processing apparatus 50 includes two processing lines 53 in each of which five processing parts 54 are linearly disposed. The processing lines 53 are disposed in parallel, the processing parts 54A and 54K at one end are connected to the load-lock part 52, and the processing parts 54E and 54F at the other end are linked by a conveying part 55. An articulated robot 1A according to the present embodiment is disposed in a conveying part 55 provided between processing parts 54.

A gate valve as a carry-in port for carrying a workpiece into a processing part 54 is provided, although not shown in the present figure, between the processing part 54 and the conveying part 55. A workpiece is carried into the processing part 54A at the utmost upstream by the carry-in part 52A. The workpiece which has been carried in is successively carried to the processing part 54B, the processing part 54C, . . . , and so on located on the downstream side by the articulated robot 1A provided in the conveying part 55, and is carried out from the processing part 54K at the utmost downstream by the carry-out part 52B.

(Operation and Effects)

Referring to FIGS. 7 to 9, conveying procedure in the in-line type processing apparatus 50 will be described. In the in-line type processing apparatus 50, the articulated robot 1A in each conveying part 55 concurrently conveys a workpiece from an upstream processing part 54 to a downstream processing part 54. The conveying procedure is the same for between processing parts 54 which are in an upstream and downstream relationship. As an example, only the procedure for conveying a workpiece from a processing part 54H as the first processing part to a processing part 54J as the second processing part will be described.

Figure 8A:
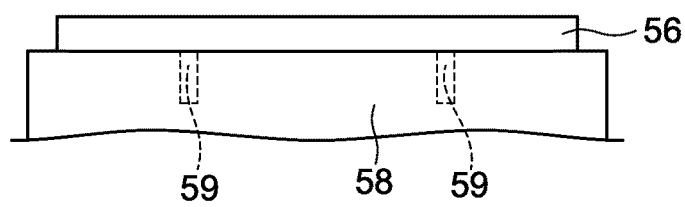
FIG. 8A shows a state in which a substrate is placed on a placing table.

FIG. 7A shows a state in which the articulated robot 1A is located at the point of origin. In the present figure, a substrate 56 as the workpiece is placed on a placing table 58 of the processing part 54H (FIG. 8A). The placing table 58 is provided with a plurality of lift pins 59. The lift pins 59 cause the substrate 56 to move up and down during conveying.

Figure 8B:
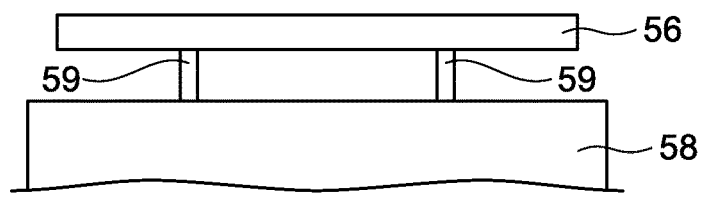
FIG. 8B shows a state in which the substrate is raised by lift pins.

Upon completion of the processing in each processing part 54H, the in-line type processing apparatus 50 starts conveying operation. The processing part 54H causes the lift pins 59 to move up thereby raising the substrate 56 (FIG. 8B). The articulated robot 1A extends the arm 2 in one direction from the point of origin. In the present figure, the articulated robot 1A extends the arm 2 towards the upstream processing part 54H. As the arm 2 extends, the grip part 3 provided at the distal end of the arm 2 advances from its one end 5E into the processing part 54H through a gate valve (FIG. 7B).

Figure 8C:
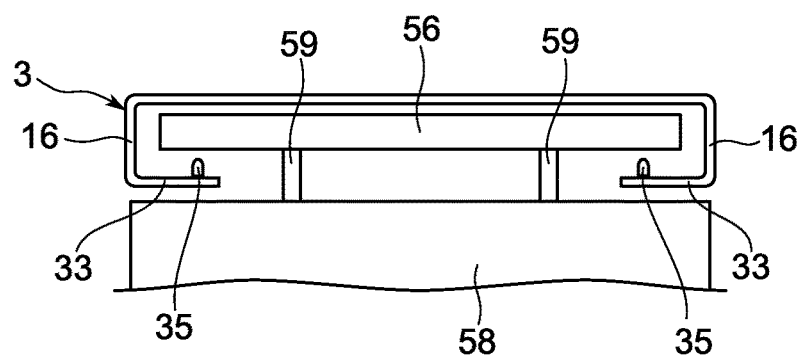
FIG. 8C shows a state in which the grip part has reached the placing table.

The grip part 3 moves to above the substrate 56 while kept in a state that the one end 5E is oriented toward the upstream side and the folded part 16 is in parallel with the moving axis W (FIG. 7C). As shown in FIG. 8C, the grip part 3 accommodates the substrate 56 in such a way that the top plate part 14 covers the upper surface of the substrate 56, and a folded surface 33 of the folded part 16 surrounds a bottom face of a side part of the substrate 56.

Figure 8D:
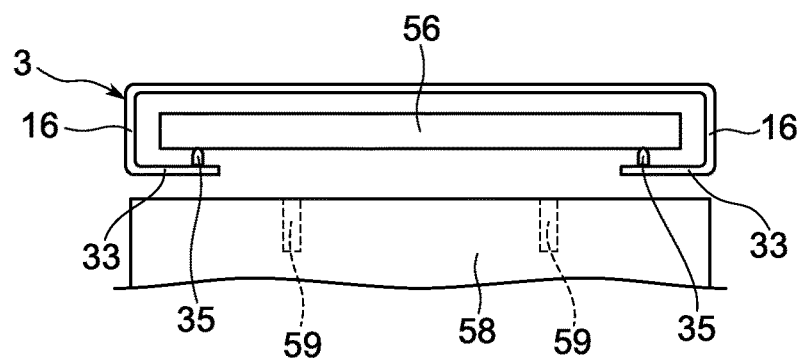
FIG. 8D shows a state in which the grip part has received the substrate.

The processing part 54H causes the lift pins 59 to move down. Then, the substrate 56 is placed, in its lower surface of side part, on a pin 35 formed in the folded surface 33 of the folded part 16 (FIG. 8D). In this way, the grip part 3 receives the substrate 56 from the placing table 58. In this state, the articulated robot 1A causes the grip part 3 to retreat from the processing part 54H by contracting the arm 2 (FIG. 7D). At this time, one end of the substrate 56 remains to be oriented toward the upstream side. The articulated robot 1A causes the grip part 3 to move further to the downstream side while the folded part 16 is kept in parallel with the moving axis W, and then to pass through the point of origin (FIG. 7E).

Figure 9A:
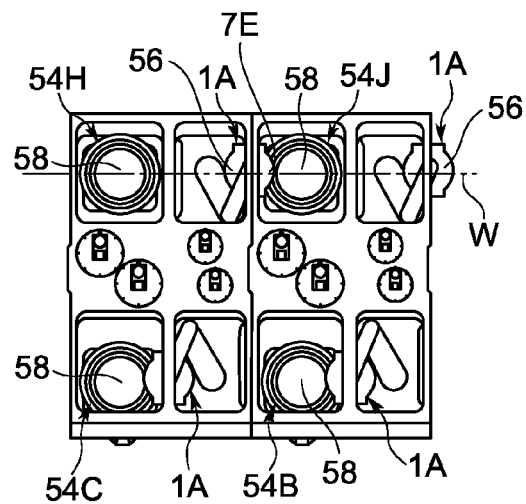
FIG. 9A shows a state in which the grip part has advanced into a processing part of downstream side.

The arm 2 causes the grip part 3 to continuously move to the downstream side while the folded part 16 is kept in parallel with the moving axis W (FIG. 9A). That is, the articulated robot 1A extends the arm 2 to the downstream side of the processing line 53. As the arm 2 is extended, the grip part 3 provided at the distal end of the arm 2 advances from its another end 7E into the processing part 54J through a gate valve.

Figure 9B:
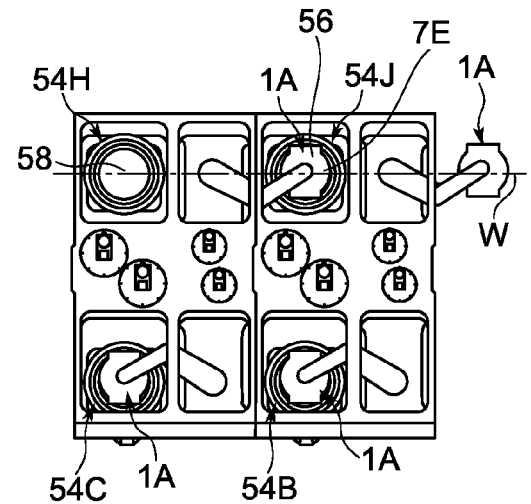
FIG. 9B shows a state in which the grip part handed over the substrate in the processing part of downstream side.

The grip part 3 moves while kept in a state that the other end 7E is orientated toward the downstream side and the folded part 16 is in parallel with the moving axis W. The grip part 3 moves until reaching above the placing table 58 of the processing part 54J in the same state as placed in the processing part 54H without causing the substrate 56 to be rotated with respect to the moving axis W (FIG. 9B and FIG. 8D).

Figure 9C:
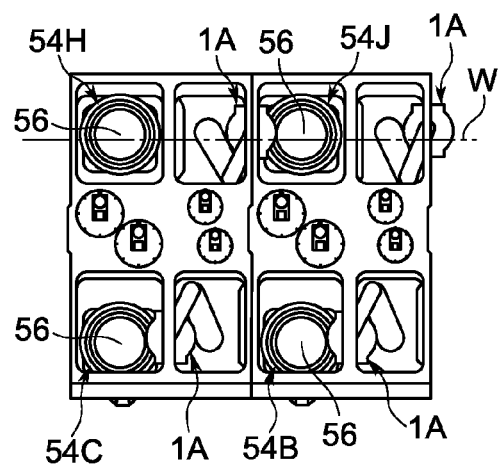
FIG. 9C shows a state in which the grip part has started retreating from the processing part of downstream side.

The processing part 54J causes the lift pins 59 to move up. Then, the substrate 56 is raised from the lower surface by the lift pins 59 (FIG. 8C). In this state, the articulated robot 1A causes the grip part 3 to retreat from the processing part 54J by contracting the arm 2 (FIG. 9C). In this way, the grip part 3 hands over the substrate 56 to the placing table 58.

Figure 9D:
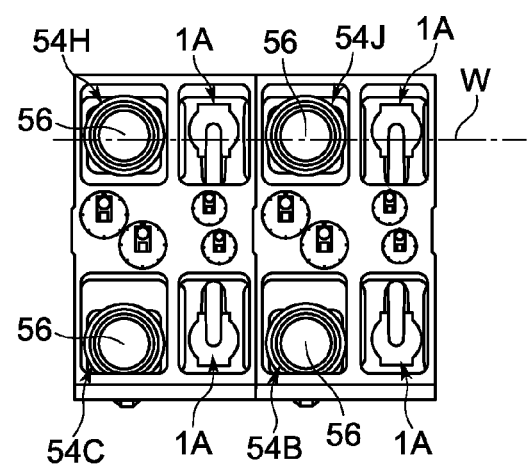
FIG. 9D shows a state in which the grip part has returned to the point of origin.

The articulated robot 1A causes the grip part 3 to move further to the downstream side while the folded part 16 is kept in parallel with the moving axis W, and then to return to the point of origin (FIG. 9D). After the grip part 3 is retreated from the processing part 54J (FIG. 8B), the processing part 54J causes the lift pins 59 to move down, thereby placing the substrate 56 on the placing table 58 (FIG. 8A). At this moment, the other end opposed to one end of the substrate 56 is oriented toward the downstream side.

The articulated robot 1A according to the present embodiment causes the grip part 3 to advance from its one end 5E into the processing part 54H, and also causes the grip part 3 to advance from its other end 7E opposed to the one end 5E into the processing part 54J. Then, since the articulated robot 1A does not need to rotate the arm 2 to align the distal end of the grip part 3 with the entrance direction of the processing part as in conventional art, it is possible to increase the conveying speed for that part. Therefore, according to an in-line type processing apparatus 50 which includes an articulated robot 1A according to the present embodiment in its conveying part 55, it is possible to dramatically increase the conveying speed.

Since the articulated robot 1A causes the grip part 3 to advance from its one end 5E into the processing part 54H, and also causes the grip part 3 to advance from its other end 7E opposed to the one end 5E into the processing part 54J, it can move the substrate 56 onto the placing table 58 of the processing part 54J in the same state as placed in the processing part 54H without causing the substrate 56 to be rotated with respect to the moving axis W.

Since the articulated robot 1A rotatably pivots the said grip part 3 at its upper part of the grip part 3 to the distal end of the second arm 6, only the grip part 3 may be inserted into between the substrate 56 placed on the lift pins 59 and the placing table 58. For that reason, it is possible to cause the grip part 3 to advance into the processing part 54 without the arm etc. interfering with the placing table 58 of the processing part 54, and thus it is possible to reduce the size of the entire apparatus, and to quickly perform handing over of the substrate 56.

The grip part 3 can receive the substrate 56 from the placing table 58 without interfering with the lift pins 59 provided in the placing table 58 of the processing part 54, or can hand over the substrate 56 to the placing table 58, by retaining the substrate 56 in the folded parts 16 provided in the side parts.

The grip part 3 can prevent foreign objects adhering to the surface of the substrate 56 while being conveyed, by being provided with a top plate part 14.

Since the distal end of the second arm 6 is rotatably pivoted substantially at a center of the grip part 3, the articulated robot 1A can easily position the substrate 56 with respect to adjoining processing parts without changing the orientation of the substrate 56.

Since the first arm 4 and the second arm 6 are formed to have a substantially equal length, the articulated robot 1A can minimize the space needed for extension and contraction.

2. Second Embodiment

An articulated robot 1B according to a second embodiment will be described with reference to the drawings.

(General Configuration)

Components similar to those of the first embodiment will be given the same reference symbols to omit the description thereof. The articulated robot 1B, in which components similar to those of FIG. 3 are given the same reference symbols, includes an angle adjustment part 60.

The angle adjustment part 60 has a rotational force imparting part 66 and a second transfer shaft 71 for transferring rotational force of the rotational force imparting part 66 to a first pulley 22. The rotational force imparting part 66 has a fourth support shaft 64 which is rotatably pivoted to a sixth bearing 78, and a lever part 69 whose one end 76 is fixed to the fourth support shaft 64. The sixth bearing 78 is fixed to the base part 9. As a result of this, the fourth support shaft 64 and the lever part 69 are rotatably pivoted to the base part 9 via the bearing 78.

The second transfer shaft 71 is formed from a cylindrical member having an inner diameter larger than the outer shape of the first support shaft 20B, and is provided concentrically with the first support shaft 20B. The fourth support shaft 64 and one end 76 of the lever part 69 are formed from cylindrical members having inner diameters larger than the outer shapes of the first support shaft 20B and a first transfer shaft 43B, respectively, and are provided concentrically with the first support shaft 20B and the first transfer shaft 43B, respectively. The first transfer shaft 43B is formed so as to connect the main shaft 38 with the first support shaft 20B.

The fourth support shaft 64 is fixed to one end of the second transfer shaft 71. The other end of the second transfer shaft 71 is fixed to the first pulley 22. The lever part 69 is linked at one end 76 to the first pulley 22 via the fourth support shaft 64 and the second transfer shaft 71. The other end 75 of the lever part 69 is derived from an insertion hole 67 formed in the side of the base part 9 to the outside of the base part 9, and linked to a linking part 72. As a result of this, the lever part 69 transfers a rotational force of the rotational force imparting part 66 to the first pulley 22 via the fourth support shaft 64 and the second transfer shaft 71.

Note that while, in the case of the above described first embodiment, the first pulley 22 is fixed to the base table 17 via the base part 9, the present embodiment differs in that the first pulley 22 is rotatably pivoted to the base part 9 via the sixth bearing 78.

Figure 11:
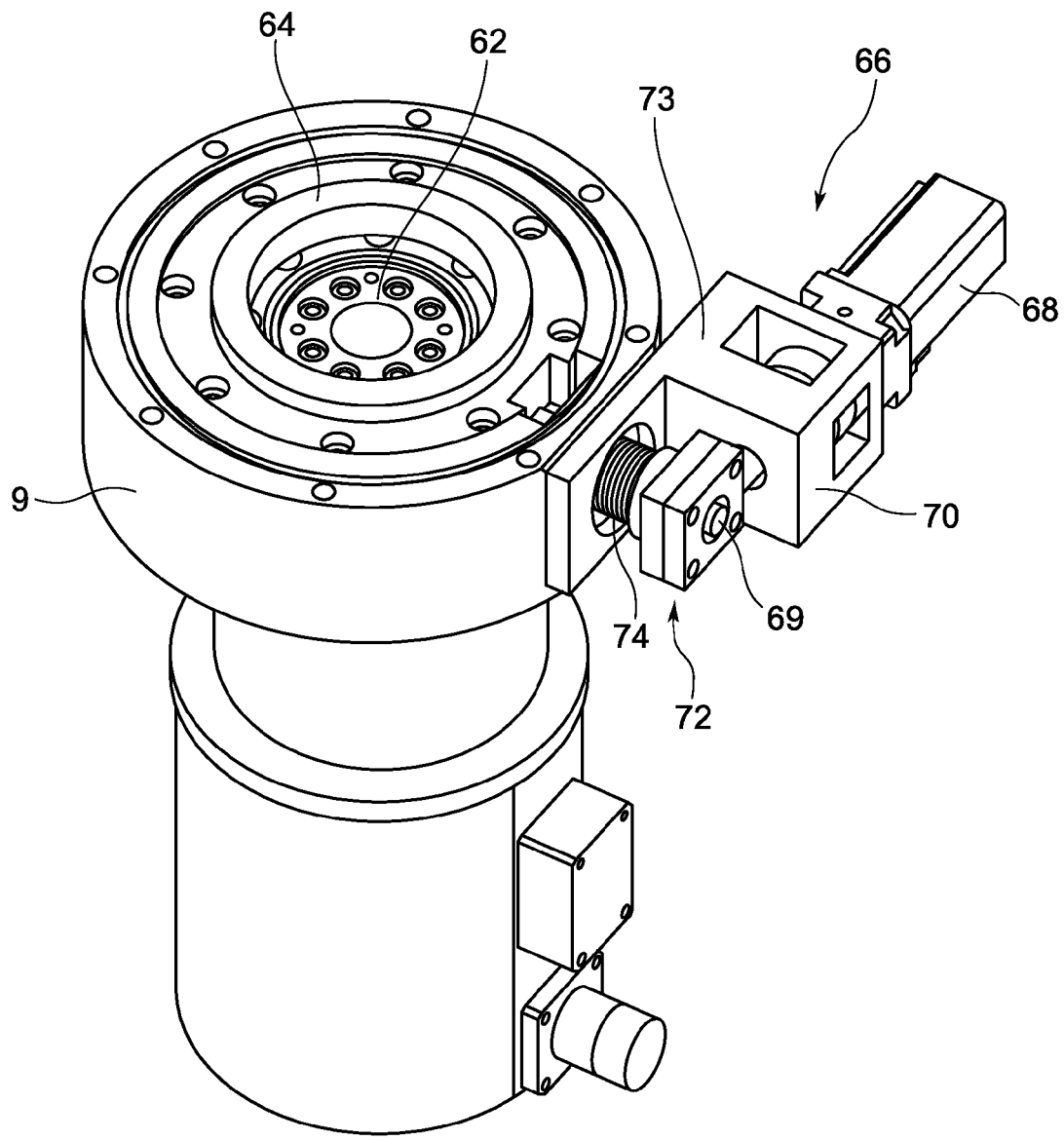
FIG. 11 is a partial perspective view of the articulated robot according to the second embodiment.

As shown in FIG. 11, the rotational force imparting part 66 has a second drive part 68, a linear motion converting part 70, the linking part 72, and a flexible part 74. The linear motion converting part 70 is directly linked to the main shaft (not shown) of the second drive part 68. In the present embodiment, a flange 73 is provided in the side of the base part 9 in alignment with the insertion hole 67. The rotational force imparting part 66 is fixed to the flange 73.

The linear motion converting part 70 converts the rotational motion of the second drive part 68 into linear motion. The linear motion converting part 70 may utilize, for example, though not particularly limited to, a ball screw and a worm screw. The linking part 72 links the linear motion converting part 70 and the other end of the lever part 69 to each other such that the longitudinal direction of the lever part 69 is orthogonal to the moving direction of the linear motion. The linking part 72 may utilize, for example, though not particularly limited to, a ball joint. The flexible part 74 is provided outside the insertion hole 67 and supports the lever part 69 against the base part 9. A bellows is utilized for the flexible part 74 in the present figure.

(Operation and Effects)

Figure 10:
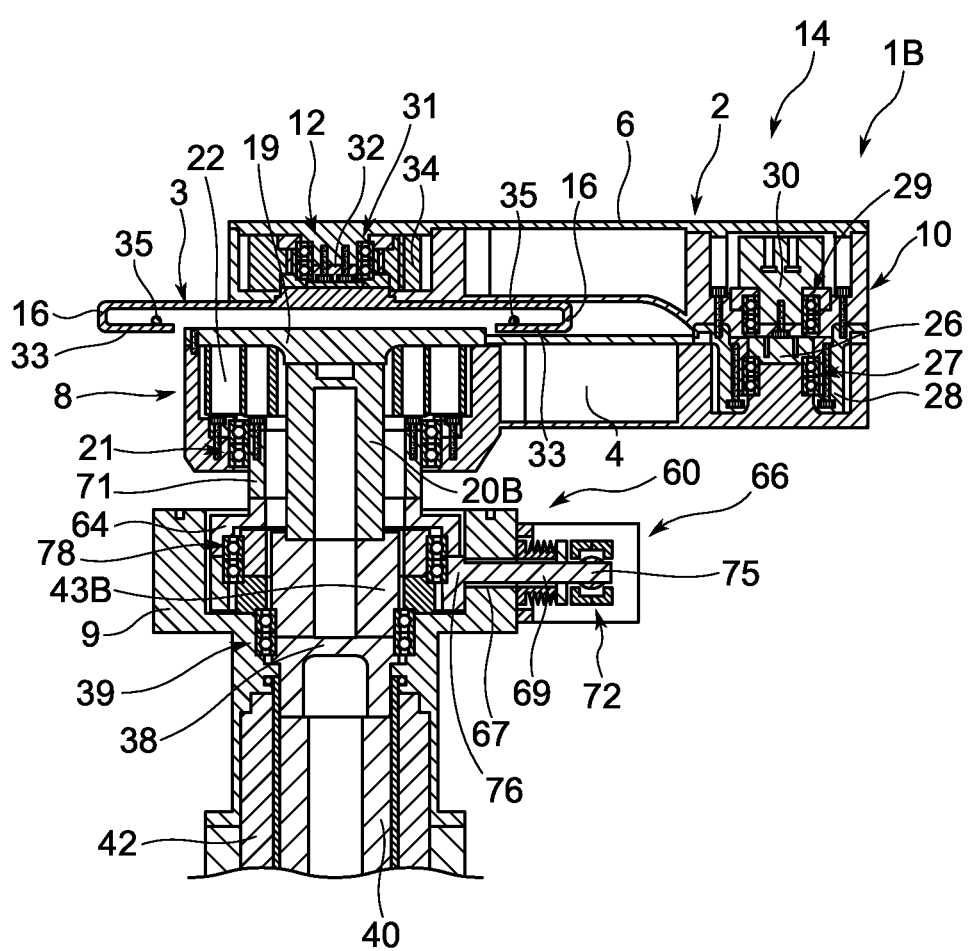
FIG. 10 is a longitudinal sectional view of an articulated robot according to a second embodiment.

Operation to adjust the position of the grip part 3 by the angle adjustment part 60 will be described. The angle adjustment part 60 finely rotates the first pulley 22 (FIG. 10) centering on the first joint part 8. As a result of this, the articulated robot 1B performs fine positional adjustment of the substrate 56 with respect to the placing table 58 by moving the distal end of the second arm 6 in a state of being extended, that is, the grip part 3 in "y" direction or "−y" direction shown in FIG. 12.

Description will be made on a case in which the position of the grip part 3 when the arm 2 is extended in one direction is finely moved in y direction. First, the second drive part 68 outputs a rotational force in a positive direction to the linear motion converting part 70. In practice, the second drive part 68 is linked to the linear motion converting part 70 via a coupling 77.

Figure 12:
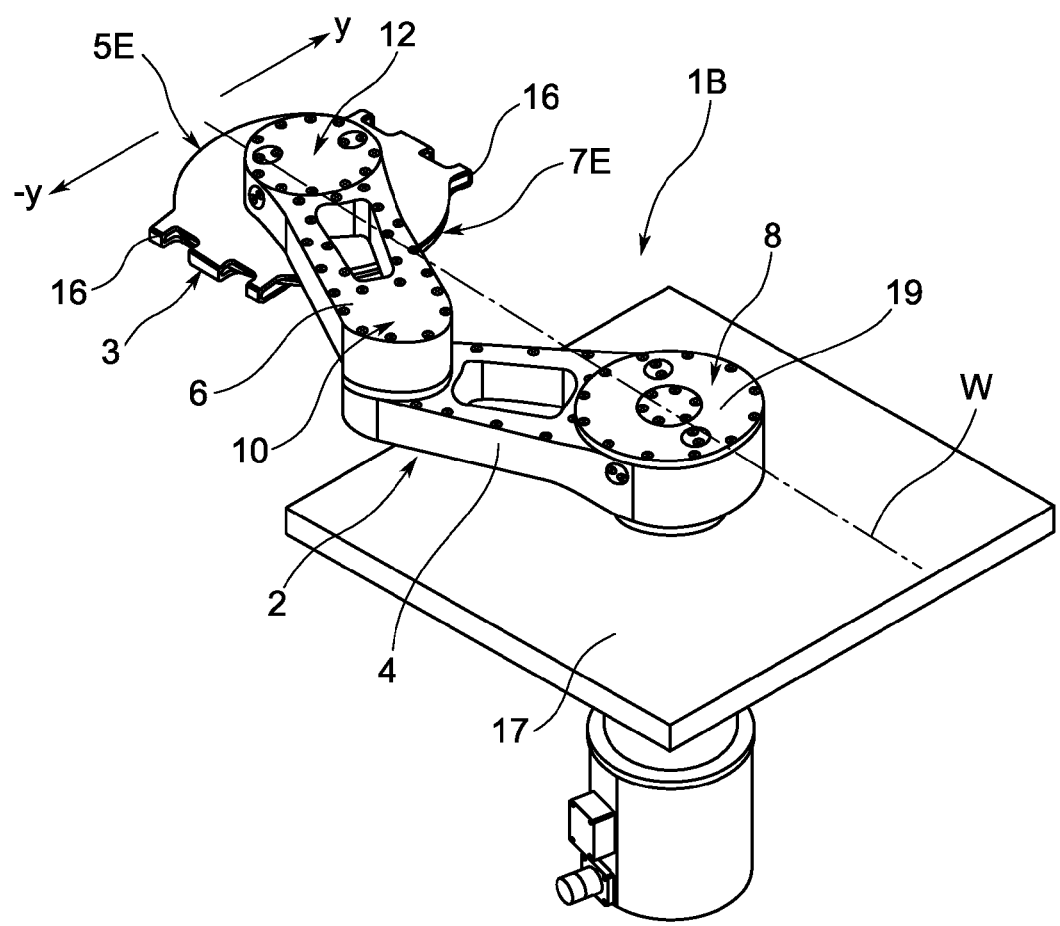
FIG. 12 is a perspective view showing a use state of the articulated robot according to the second embodiment, in which the arm is extended in one direction.
Figure 13:
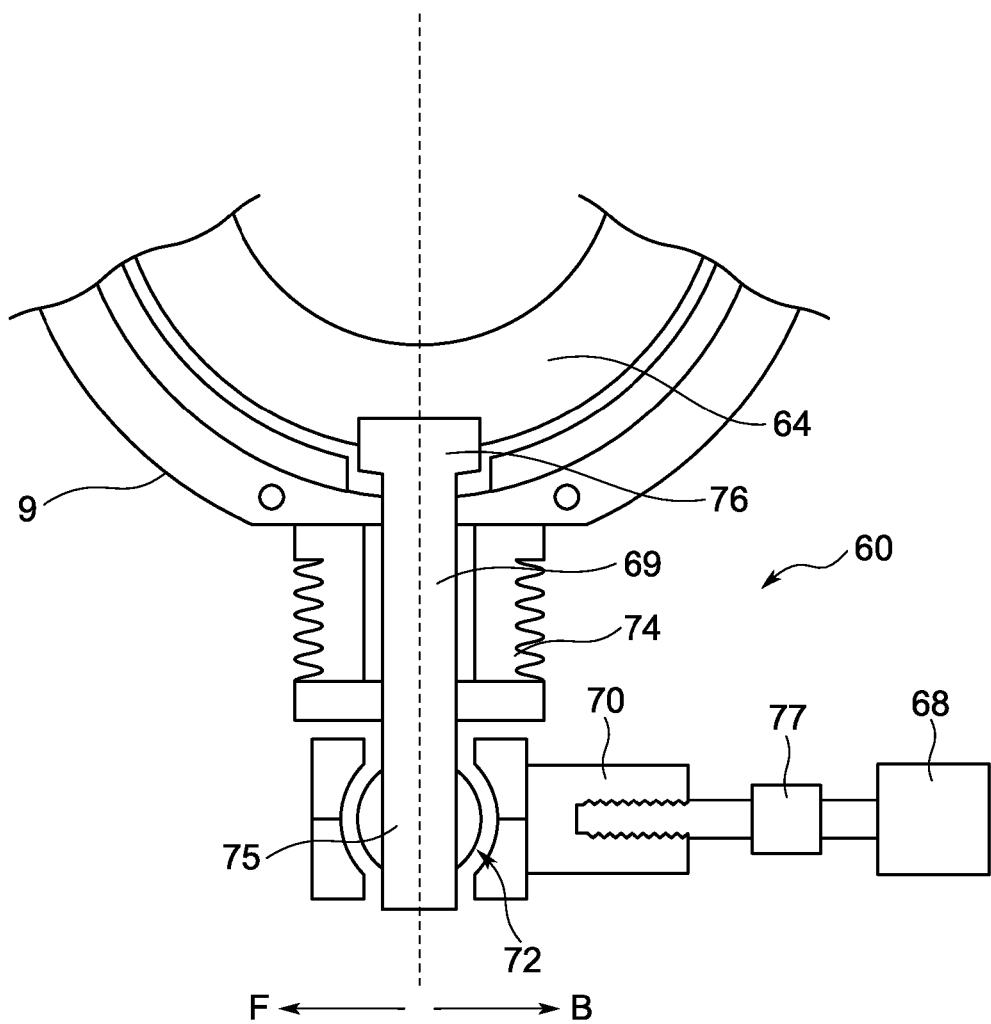
FIG. 13 is a schematic view showing a configuration of an angle adjustment part according to the second embodiment.

The linear motion converting part 70 pushes out the linking part 72 in F direction in FIG. 12 by a rotational force in the positive direction. This causes the linking part 72 to push out the other end 75 of the lever part 69 in F direction in the figure.

Then, since one end of the lever part 69 is fixed to the fourth support shaft 64, the lever part 69 rotates in the clockwise direction centering on the fourth support shaft 64. At this moment, the flexible part 74 is deformed along with the lever part 69. Since the one end 76 of the lever part 69 is fixed to the fourth support shaft 64, the fourth support shaft 64 is finely rotated in the clockwise direction integrally with the lever part 69.

Figure 14:
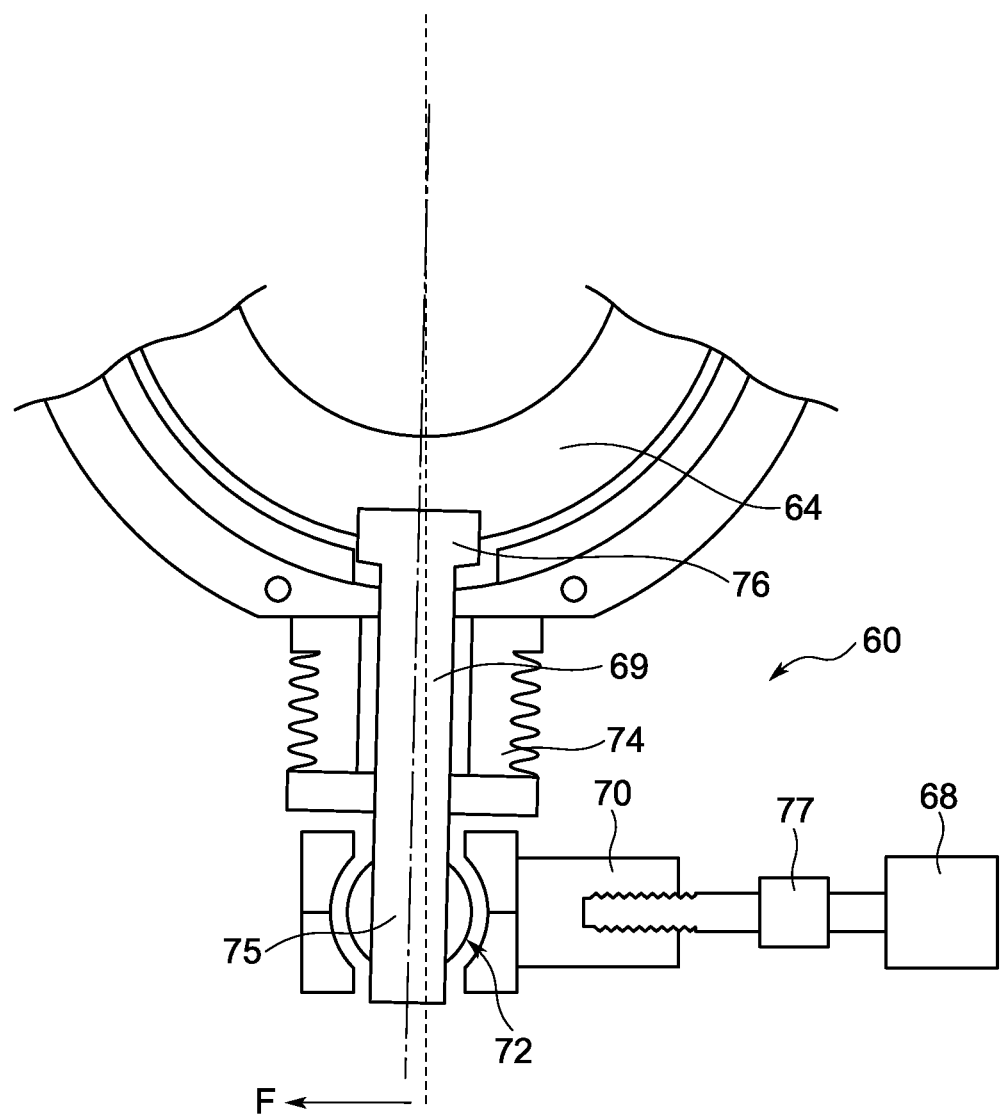
FIG. 14 is a schematic view showing a use state of the angle adjustment part according to the second embodiment in which a fourth support shaft has been rotated in a clockwise direction.

Since the fourth support shaft 64 is linked to the first pulley 22 via the second transfer shaft 71, the first pulley 22 is finely rotated in the clockwise direction along with the fourth support shaft 64 (FIG. 14). In this way, the angle adjustment part 60 can move the position of the grip part 3 in a state in which the arm 2 is extended in one direction, in y direction shown in FIG. 12.

Next, description will be made on the case in which the position of the grip part 3 in a state in which the arm 2 is extended in one direction is finely moved in −y direction. First, the second drive part 68 outputs a rotational force in the reverse direction to the linear motion converting part 70. The rotational force in the reverse direction causes the linear motion converting part 70 to withdraw the other end 75 of the lever part 69 linked to the linking part 72 in B direction in the figure.

Then, the lever part 69 rotates in the counterclockwise direction centering on the fourth support shaft 64. Since one end 76 of the lever part 69 is fixed to the fourth support shaft 64, the fourth support shaft 64 is finely rotated in the counterclockwise direction integrally with the lever part 69.

Figure 15:
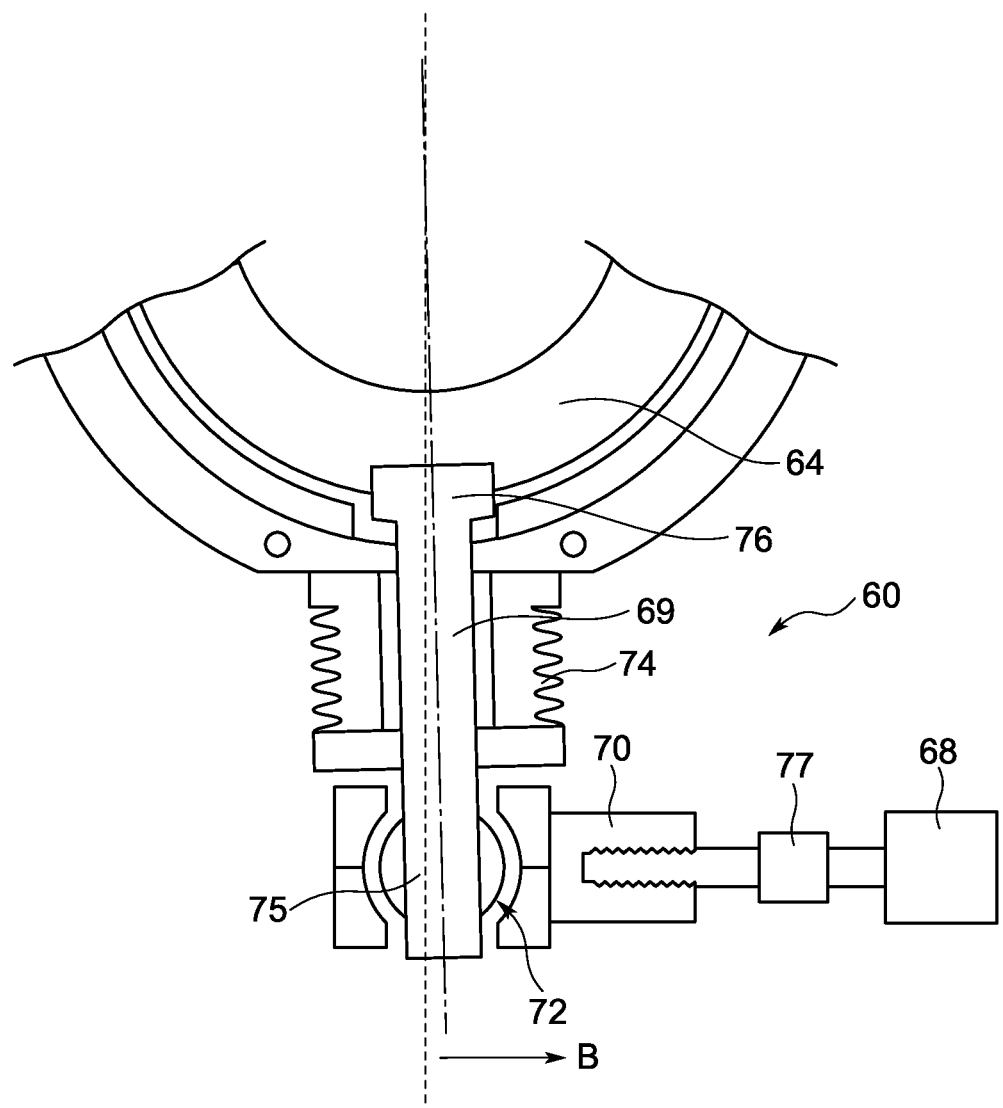
FIG. 15 is a schematic view showing a use state of the angle adjustment part according to the second embodiment in which the fourth support shaft has been rotated in a counterclockwise direction.

Since the fourth support shaft 64 is linked to the first pulley 22 via the second transfer shaft 71, the first pulley 22 is finely rotated in the counterclockwise direction along with the fourth support shaft 64 (FIG. 15). In this way, the angle adjustment part 60 can move the position of the grip part 3 in a state in which the arm 2 is extended in one direction, in −y direction as shown in FIG. 12.

Figure 16:
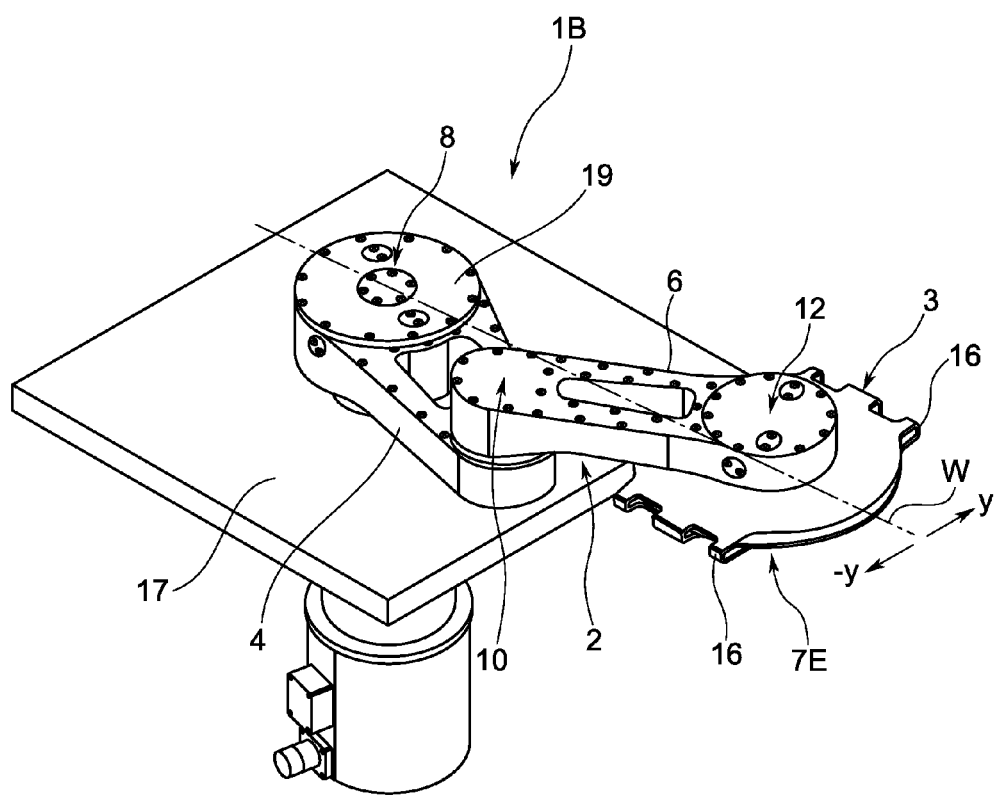
FIG. 16 is a perspective view showing a use state of the articulated robot according to the second embodiment, in which the arm is extended in another direction.

As shown in FIG. 16, when the arm 2 is extended in the other direction, it is possible to finely move the position of the grip part 3 in y direction by, contrary to what has been described above, finely rotating the first pulley 22 in the counterclockwise direction and rotating the first transfer shaft 43B. Moreover, when the arm 2 is extended in the other direction, it is possible to finely move the position of the grip part 3 in −y direction by, contrary to what has been described above, finely rotating the first pulley 22 in the clockwise direction and rotating the first transfer shaft 43B.

The articulated robot 1B can finely rotate the first pulley 22 in the clockwise direction or counterclockwise direction at the angle adjustment part 60 to move the position of the grip part 3 in y direction or −y direction. Therefore, the articulated robot 1B can easily adjust the position of the substrate 56 gripped by the grip part 3 to the position of the placing table 58 in the processing part 54 by extending or contracting the arm 2 to move the grip part 3 in the moving axis W direction, and rotating the first pulley 22 at the angle adjustment part 60 to move the grip part 3 in y direction or −y direction.

Since an in-line type processing apparatus 50 (FIG. 6) is formed by linearly connecting a plurality of processing parts 54 and conveying parts 55, a fine deviation occurs between the processing parts 54 in the moving axis W direction and y direction or −y direction orthogonal to the moving axis W direction. A deviation in the moving axis W direction can be absorbed by extending or contracting the arm 2. A deviation in y direction or −y direction orthogonal to the moving axis W direction can be absorbed by the above described angle adjustment part 60.

The articulated robot 1B according to the present embodiment absorbs a deviation in y direction or −y direction orthogonal to the moving axis W direction by means of the angle adjustment part 60. Since it is only necessary for the angle adjustment part 60 to finely rotate the fourth support shaft 64, the second drive part 68 can be reduced in size compared with the first drive part 36. Therefore, the angle adjustment part 60 can be simplified in configuration as well as reduced in size.

3. Third Embodiment

Figure 17:
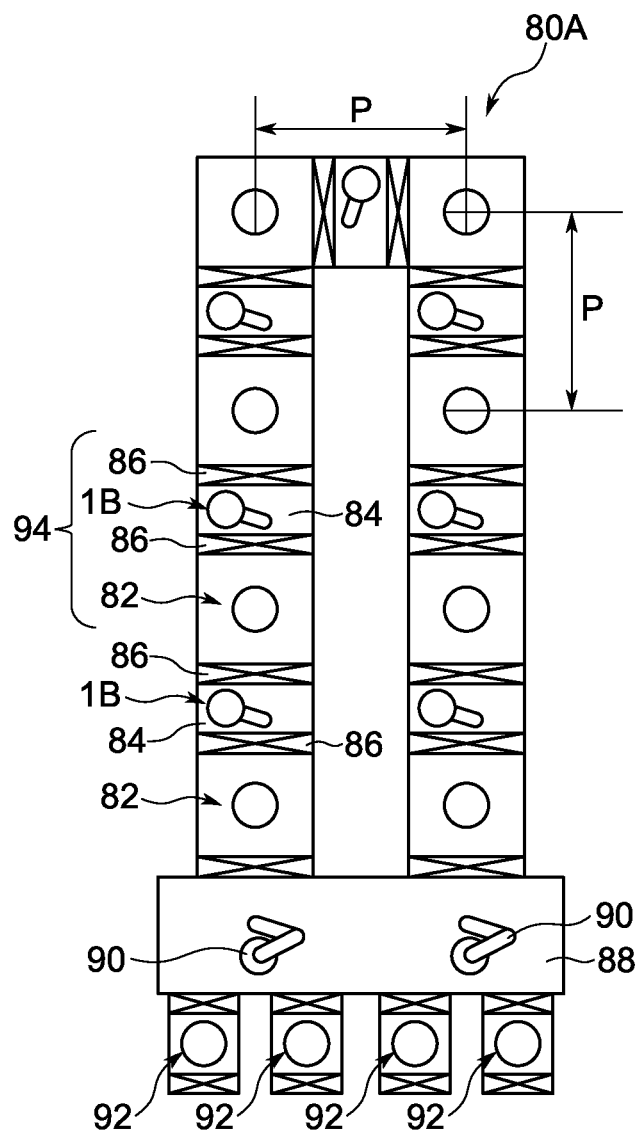
FIG. 17 is a plan view schematically showing a configuration of an in-line type processing apparatus according to a third embodiment.

An embodiment of the in-line type processing apparatus according to the present invention will be described with reference to the drawings. An in-line type processing apparatus 80A shown in FIG. 17 has a processing line in which processing parts 82 and conveying parts 84 are linearly disposed. The processing line as a whole is formed into an inverted U-shape. A gate valve 86 is provided between a processing part 82 and a conveying part 84. An articulated robot 1B is provided in a conveying part 84.

Provided at one end of the processing line is a buffer chamber 88 which feeds a substrate before processing and receives a substrate after processing to and from the processing line. A plurality of (two, in the present figure) known scholar robots 90 are provided in the buffer chamber 88. Provided in the buffer chamber 88 are a plurality of (four, in the present figure) load lock parts 92 which store substrates before processing and substrates after processing for the said buffer chamber 88.

Since the articulated robot 1B having the angle adjustment part 60 is provided in each conveying part 84, and thereby the in-line type processing apparatus 80A according to the present embodiment can easily absorb a deviation between processing parts 82, it is possible to form a long processing line easily.

In the in-line type processing apparatus 80A, a distance P between processing parts 82 interposing a conveying part 84 is constant. Therefore, it is possible to form a conveying module 94 having a unit made up of one conveying part 84, gate valves 86 linked to both sides of the said conveying part 84, and one processing part 82 linked to one of the said gate valves 86.

Figure 18:
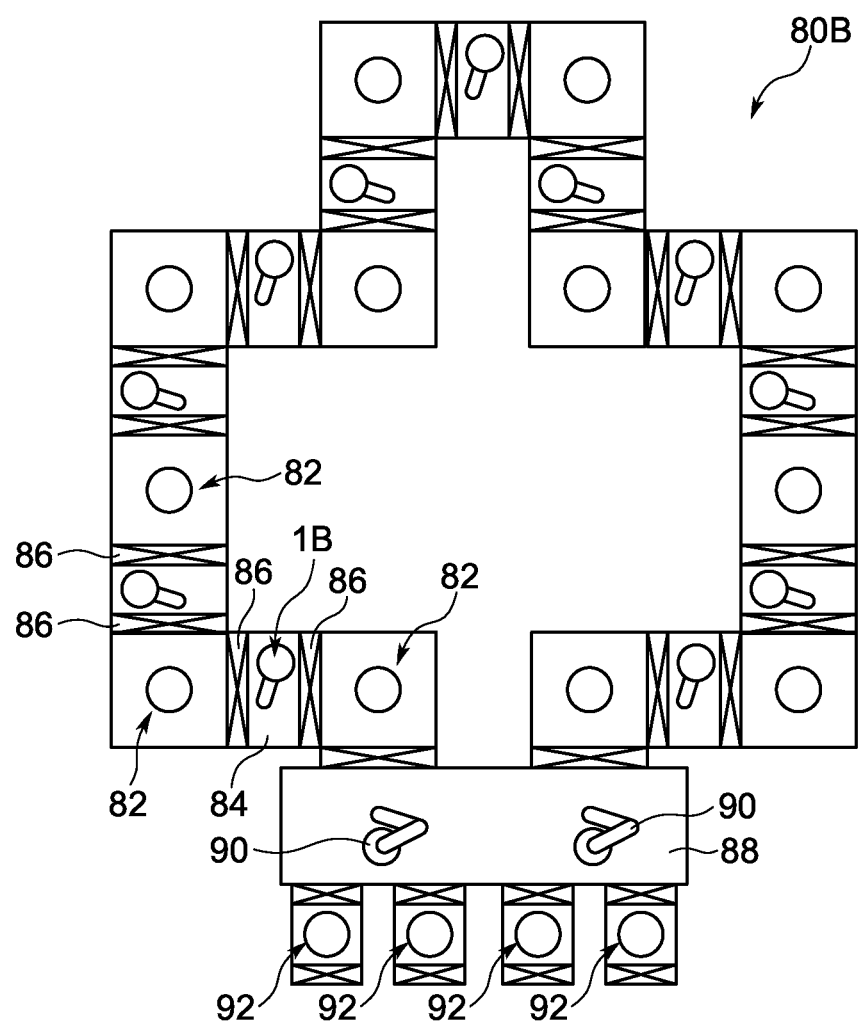
FIG. 18 is a plan view schematically showing a configuration of an in-line type processing apparatus according to a modification.

The in-line type processing apparatus 80B shown in FIG. 18 is an example to show that the processing line can be formed into a desired shape by using the above described conveying module 94. As shown in the present figure, by appropriately combining the conveying modules 94, it is possible to switch the direction of the processing line. Thus, since appropriately combining conveying modules 94 allows an in-line type processing apparatus 80B to be laid out to have a desired shape, it becomes possible to utilize space more effectively.

4. Modification

The present invention will not be limited to the above described embodiments, and can be appropriately modified within the spirit of the present invention. Although, in the case of the above described embodiments, description has been made on a case in which a total of four pins 35 in the grip part 3 are provided in the folded surface 33 of the folded part 16, the present invention will not be limited to this case, and the number of the pins may be three, or not less than five.

While configurations of the in-line type processing apparatus have been shown as examples, the numbers of the processing parts and the conveying parts are not limited to those of the above described embodiments, and can be appropriately increased or decreased.

Although, in the case of the above described embodiments, description has been made on a case in which the first arm and the second arm are formed to have a substantially equal length, the present invention will not be limited thereto, and the first arm may be larger than the second arm, or vice versa.

The invention claimed is:

1. A standing articulated robot provided with a base part fixed to a base table, and for conveying a workpiece from a first processing part to a second processing part linearly disposed along an assembly line with respect to the first processing part, the articulated robot comprising:
   a drive part being fixed to the base part;
   a first arm rotatably linked to the base part by a first joint part coaxially arranged to the drive part;
   a second arm rotatably linked to the first arm by a second joint part so as to overlap on the first arm; and
   a grip part for gripping the workpiece, the grip part being provided in a space in a vertical direction between the first arm and the second arm at a distal end of the second arm, and rotatably linked to the second arm by a third joint part, wherein
   the grip part is advanced from one end of the grip part into the first processing part, and also the grip part is advanced from another end opposite to the one end of the grip part into the second processing part.

2. The articulated robot according to claim 1, wherein
   the drive part comprises a rotor, and a stator provided concentrically with the rotor; and
   an isolation wall is provided between the rotor and the stator.

3. The articulated robot according to claim 2, wherein
   the first joint part comprises a first support shaft fixed to a base end of the first arm and linked to the drive part, and a first pulley being concentrically with the first support shaft and rotatably supported to the base part, and
further comprising an angle adjustment part, the angle adjustment part including:
   a transfer shaft linked to the first pulley; and
   a support shaft for imparting a rotational force to the transfer shaft, wherein
   the angle adjustment part moves the grip part in a direction orthogonal to a moving axis linking the first processing part with the second processing part by rotating the first pulley with respect to the base table via the transfer shaft having the rotational force given from the support shaft.

4. The articulated robot according to claim 1, wherein
the first joint part comprises a first support shaft fixed to a base end of the first arm, and linked to the drive part, and a first pulley, the first pulley being concentrically with the first support shaft and fixed to the base part;
the second joint part comprises a second support shaft fixed to a distal end of the first arm, a second pulley rotatably pivoted to the second support shaft, and a third pulley fixed to a distal end of the second support shaft; and
the third joint part comprises a third support shaft fixed to a distal end of the second arm, and a fourth pulley rotatably pivoted to the third support shaft, wherein
each of belts is mounted over and between the first pulley and the second pulley, and over and between the third pulley and the fourth pulley.

5. The articulated robot according to claim 4, wherein
a rotational ratio between the first pulley and the second pulley is set to 1:2, and
a rotational ratio between the third pulley and the fourth pulley is set to 2:1.

6. The articulated robot according to claim 1, wherein
the grip part comprises a top plate part having a disc shape and folded parts being located at both sides of the top plate part and bent in a U shape, wherein
a lower surface of each side part of the workpiece is supported by the folded parts.

7. The articulated robot according to claim 1, wherein a length of the first arm is substantially equal to that of the second arm.

8. A conveying device, comprising:
a first processing part; and
a conveying part interconnected with the first processing part, wherein
the conveying part is provided with a standing articulated robot, the articulated robot including:
a base part fixed to a base table;
a drive part being fixed to the base part;
a first arm rotatably linked to the base part by a first joint part coaxially arranged to the drive part;
a second arm rotatably linked to the first arm by a second joint part so as to overlap on the first arm; and
a grip part for gripping a workpiece, the grip part being provided in a space in a vertical direction between the first arm and the second arm at a distal end of the second arm, and being rotatably linked to the second arm by a third joint part, wherein
the articulated robot causes the grip part to advance from one end of the grip part into the first processing part, and causes the grip part to advance from another end opposite to the one end of the grip part into a second processing part, the second processing part being linearly disposed along an assembly line with respect to the first processing part with the conveying part being interposed therebetween.

9. The conveying device according to claim 8, wherein a length of the first arm is substantially equal to that of the second arm.

* * * * *